(12) United States Patent
Kleemann et al.

(10) Patent No.: US 12,317,665 B2
(45) Date of Patent: May 27, 2025

(54) ORGANIC THIN FILM TRANSISTOR AND METHOD FOR PRODUCING SAME

(71) Applicant: Technische Universität Dresden, Dresden (DE)

(72) Inventors: Hans Kleemann, Dresden (DE); Seongae Park, Ilmenau (DE); Jörn Vahland, Dresden (DE)

(73) Assignee: Flexora GmbH, Dresden (DE)

( * ) Notice: Subject to any disclaimer, the term of this patent is extended or adjusted under 35 U.S.C. 154(b) by 235 days.

(21) Appl. No.: 17/418,303

(22) PCT Filed: Jan. 17, 2020

(86) PCT No.: PCT/EP2020/051185
§ 371 (c)(1),
(2) Date: Jun. 25, 2021

(87) PCT Pub. No.: WO2020/152061
PCT Pub. Date: Jul. 30, 2020

(65) Prior Publication Data
US 2021/0391549 A1     Dec. 16, 2021

(30) Foreign Application Priority Data
Jan. 23, 2019   (DE) .................... 10 2019 200 810.0

(51) Int. Cl.
*H10K 10/46* (2023.01)
*H10K 10/84* (2023.01)
*H10K 10/88* (2023.01)

(52) U.S. Cl.
CPC ......... *H10K 10/464* (2023.02); *H10K 10/481* (2023.02); *H10K 10/84* (2023.02); *H10K 10/88* (2023.02)

(58) Field of Classification Search
CPC ...... H10K 10/88; H10K 10/481; H10K 10/84; H10K 10/464; H10K 10/482; H10K 71/60; H10K 71/233; H10D 30/6731
See application file for complete search history.

(56) References Cited

U.S. PATENT DOCUMENTS 8,450,142 B2    5/2013   Hotta et al.
2001/0031419 A1*  10/2001  Nunomura ............ G03F 7/0233
                                                   430/326
(Continued)

FOREIGN PATENT DOCUMENTS

| WO | 03/052841 A1 | 6/2003 |
| WO | 2013/017170 A1 | 2/2013 |
| WO | 2018/029160 A1 | 2/2018 |

OTHER PUBLICATIONS

International Search Report and Written Opinion for International Application PCT/EP2020/051185; Mailed on May 6, 2020.
(Continued)

*Primary Examiner* — Britt D Hanley
*Assistant Examiner* — Kevin Quinto
(74) *Attorney, Agent, or Firm* — The Dobrusin Law Firm, P.C.

(57) ABSTRACT

An organic thin film transistor (OTFT), in particular thin-film field-effect transistor (OFET), that includes a substrate, a source electrode, a drain electrode, a gate electrode arranged in a top gate arrangement, and an organic semiconductor functional layer. The source electrode, the drain electrode, and the gate electrode are arranged in a coplanar (Continued)

layer structure. The organic thin-film transistor has an intermediate layer for the capacitive decoupling of the gate electrode from the source electrode and/or from the drain electrode.

20 Claims, 3 Drawing Sheets

(56) References Cited

U.S. PATENT DOCUMENTS

| | | | |
|---|---|---|---|
| 2003/0092232 A1 | 5/2003 | Klauk et al. | |
| 2003/0218166 A1* | 11/2003 | Tsutsui | H10K 10/468 257/40 |
| 2005/0029593 A1* | 2/2005 | Kudo | H01L 29/78621 438/149 |
| 2006/0054883 A1* | 3/2006 | Hanna | H10K 10/84 257/40 |
| 2006/0270066 A1* | 11/2006 | Imahayashi | H10K 10/462 438/4 |
| 2007/0020821 A1* | 1/2007 | Toyoda | H10K 10/464 438/149 |
| 2009/0026443 A1* | 1/2009 | Ohta | H10K 10/478 257/40 |
| 2010/0051922 A1* | 3/2010 | Hotta | H10K 10/464 438/151 |
| 2010/0127268 A1 | 5/2010 | Daniel et al. | |
| 2010/0213547 A1* | 8/2010 | He | B82Y 10/00 716/30 |
| 2011/0266523 A1* | 11/2011 | Shukla | C09B 3/18 257/E51.025 |
| 2013/0075734 A1* | 3/2013 | Cain | H10K 71/00 257/66 |
| 2013/0244374 A1* | 9/2013 | Okazaki | H01L 29/4908 438/104 |
| 2015/0030981 A1* | 1/2015 | Robello | C09B 69/008 430/315 |
| 2015/0140729 A1* | 5/2015 | Ferro | H10K 10/84 430/315 |
| 2016/0268527 A1* | 9/2016 | Fong | H10K 10/84 |
| 2017/0069859 A1* | 3/2017 | Lee | H10K 85/113 |
| 2017/0092865 A1* | 3/2017 | Yuning | C08G 61/126 |
| 2017/0200894 A1* | 7/2017 | Ford | H10K 10/488 |
| 2018/0040641 A1* | 2/2018 | Yamazaki | H01L 21/467 |
| 2018/0062087 A1* | 3/2018 | Hamada | H01L 29/786 |
| 2019/0115440 A1* | 4/2019 | Lee | H01L 29/458 |
| 2019/0267462 A1* | 8/2019 | Price | H01L 29/4908 |

OTHER PUBLICATIONS

Nakayama K. High-Mobility Organic Transistors with Wet-Etch-Patterned Top Electrodes: A Novel Patterning Method for Fine-Pitch Integration of Organic Devices. In: Adv. Mater. Interfaces, vol. 1, (2014).

Parashkov [et al]: Vertical channel all-organic thin-film transistors. In: Appl. Phys. Lett., vol. 82, pp. 4579-4580. (2003).

S. Higgins et al., Adv. Electronic Materials, vol. 1, p. 1500024 (2015).

C. Ha et al., High Reliable a-IGZO TFTs with Self-Aligned Coplanar Structure for Large-Sized Ultrahigh-Definition OLED TV, (2015), p. 1022.

Y. Noh et al., "Downscaling of self-aligned, all-printed polymer thin-film transistors", Nature Nanotechnology, (2007), vol. 2, p. 784.

T. Hyodo et al., "Self-Aligned Organic Field-Effect Transistors Using Back-Surface Exposure Method", Japanese Journal of Applied Physics, (2004), vol. 43, No. 4, pp. 2323-232.

S. Higgins et al., "Self-Aligned Megahertz Organic Transistors Solution-Processed on Plastic", Adv. Electronic Materials, (2015), vol. 1, p. 1500024.

Boudinet D et al: "Modification of gold source and drain electrodes by self-assembled monolayer in staggered n-and p-channel organic thin film transistors", Organic Electronics, Elsevier, Amsterdam, NL, vo. 11, No. 2, (2809), pp. 227-237, abstract p. 228-p. 229; figure 1.

Malte Jesper et al: "Dipolar SAM5 Reduce Charge Carrier Injection Barriers in n-Channel Organic Field Effect Transistors", Langmuir, vol. 31, No. 37, (2015), pp. 10303-10309.

Oliver Fenwick et al: "Modulating the charge injection in organic field-effect transistors: fluorinated oligophenyl self-assembled monolayers for high work function electrodes", Journal of Materials Chemistry C: Materials for Optical and Electronic Devices, vol. 3, No. 13, (2015) pp. 3087-3015.

International Preliminary Report on Patentability for PCT/EP2020/051185, issued on Jul. 27, 2021.

European Search Report dated Aug. 17, 2022, for European Application EP20701710.4.

* cited by examiner

ORGANIC THIN FILM TRANSISTOR AND METHOD FOR PRODUCING SAME

PRIORITY

This application is a national stage entry of PCT/EP2020/051185 filed on Jan. 17, 2020, which claims priority to DE 10 2019 200 810.0 filed Jan. 23, 2019, all of which are incorporated by reference herein for all purposes.

FIELD

The present invention is based on an organic thin film transistor (OTFT), in particular thin film field effect transistor (OFET), comprising a source electrode, a drain electrode, a gate electrode arranged in a top gate arrangement, and an organic semiconductor functional layer, wherein the source electrode, the drain electrode and the gate electrode are arranged in a coplanar layer structure. In this case, the gate electrode is separated from the semiconductor layers by a suitable insulator.

BACKGROUND

Four different thin film transistor architectures exist in principle: 1. bottom-gate/bottom-contact (BGBC or coplanar BG), 2. bottom-gate/top-contact (BGTC or staggered BG), 3. top-gate/top-contact (TGTC or coplanar TG) and 4. top-gate/bottom-contact (TGBC or staggered BG).

Present-day silicon-based semiconductor technology is dominated by the 3rd architecture (top-gate/top-contact (TGTC or coplanar TG)), that is to say a coplanar layer structure with a gate electrode at the top, wherein the semiconducting layer lies between the substrate and the gate electrode, since so-called self-patterned electrodes (also referred to as self-aligning electrodes) can be realized in this case. This means that the gate electrode is used as a mask during the doping of the source and drain regions, thereby ensuring only a slight overlap between the gate and the respective edge region of source and drain. Such self-patterned electrodes significantly reduce the parasitic capacitances of the transistor and thus make possible fast and energy-efficient semiconductor components.

"High Reliable a-IGZO TFTs with Self-Aligned Coplanar Structure for Large-Sized Ultrahigh-Definition OLED TV", C. Ha et al., SID's Digest 69.2, p. 1022 (2015) discloses the application of such self-patterned electrodes in association with a transparent conductive oxide such as amorphous indium gallium tin oxide (a-IGZO) for use in ultrathin, high-definition displays.

The great majority of present-day thin film transistors do not use self-patterned electrodes, such that the gate-drain overlap and the gate-source overlap contribute a significant proportion of the total capacitance. The influence of these parasitic overlap capacitances becomes clear from the unity-gain cut-off frequency $f_T$:

$$f_T = \frac{g_m}{2\pi(C_{Ch} + 2C_{OV})} = \frac{g_m}{2\pi C_0 / W(L + 2L_{OV})}$$

where $g_m$ is the transconductance, $C_{Ch}$ is the channel capacitance, $C_{OV}$ is the parasitic overlap capacitance, $C_0$ is the specific oxide capacitance, W is the channel width, L is the channel length and $L_{OV}$ is the overlap length.

Error tolerances of $L_{OV} \geq 3.5$ μm are necessary in practice, as a result of which the unity-gain cut-off frequency $f_T$ is principally determined by the parasitic overlap length and to a lesser extent by the channel length itself. The consequence of this is that the unity-gain cut-off frequencies $f_T$ of organic thin film transistors have not improved in recent years, even though the charge carrier mobility is continuously increasing as a result of further developments.

In order to avoid this disadvantage of conventional organic transistors, various concepts for OTFTs having self-patterned electrodes have been investigated. "Downscaling of self-aligned, all-printed polymer thin-film transistors", Y. Noh et al., Vol. 2, p. 784, Nature Nanotechnology (2007) discloses a self-patterned organic transistor in a staggered top gate geometry. In this case, a channel length (distance between source and drain electrodes) of <1 μm is realized by means of a printing method. The gate electrode is patterned by photolithography in a second patterning step. In this case, source and drain electrodes serve as an exposure mask. In order to make this patterning possible, the photolithography has to be effected from the back through the substrate (back exposure or through-substrate exposure method). However, this method results in severe limitations with regard to the lithographic resolution and the electrode geometry to be realized. Further self-patterned organic transistors are known e.g. from "Self-Aligned Organic Field-Effect Transistors Using Back-Surface Exposure Method", T. Hyodo et al., Japanese Journal of Applied Physics, Vol. 43, No. 4B pp. 2323-232 (2004) and "Self-Aligned Megahertz Organic Transistors Solution-Processed on Plastic", S. Higgins et al., Adv. Electronic Materials, Vol. 1, p. 1500024 (2015). Bottom gate transistors in a coplanar (Hyodo) and staggered (Higgins) geometry are presented in both steps. These two methods are also based on a photolithography step in which through-substrate exposure has to be effected. Furthermore, so-called lift-off processes have to be used for the patterning of source and drain, said processes not being suitable for industrial so production. Self-patterned organic transistors in a coplanar top gate geometry have not been reported in the prior art.

A further disadvantage of the organic thin film transistors (OTFT) known from the prior art is the known "voltage kickback" (VKB) effect which occurs therein, and which has the effect that when the transistor is turned off, the stored capacitance is discharged via the gate-drain capacitance and the stored voltage information is thus lost. This effect constitutes the greatest limitation for the use of organic thin film transistors (OTFT) in active matrix displays.

SUMMARY

It is therefore an object of the present invention to provide an organic thin film transistor (OTFT) which achieves a higher unity-gain cut-off frequency $f_T$ and in which the "voltage kickback" effect is suppressed.

This object is achieved by means of an organic thin film transistor (OTFT), in particular thin film field effect transistor (OFET), comprising a source electrode, a drain electrode, a gate electrode arranged in a top gate arrangement, and an organic semiconductor functional layer, wherein the source electrode, the drain electrode and the gate electrode are arranged in a coplanar layer structure, wherein the organic thin film transistor comprises an intermediate layer for the capacitive decoupling of the gate electrode from the source electrode and/or from the drain electrode.

The thin film transistor according to the invention has the advantage over the prior art that significantly lower parasitic capacitances between gate and source and between gate and drain are achieved owing to the use of the implemented intermediate layer. As a result, advantageously the unity-gain cut-off frequency $f_T$ can be increased and the "voltage kickback" (VKB) effect can be reduced, as a result of which the organic thin film transistor according to the invention becomes faster and more energy-efficient and can find application for example in high-definition active matrix displays. Moreover, the technique of self-patterned electrodes can be employed during the production of the thin film transistor according to the invention, since metals on top of organic semiconductors, that is to say in the coplanar top gate arrangement employed here, can be patterned by wet etching, without the organic semiconductor being damaged in the process. The top gate arrangement within the meaning of the present invention means, in particular, that the organic semiconductor functional layer is arranged between the substrate and the gate electrode. The self-patterned electrodes result in only a small and well-defined overlap between the gate and the respective edge region of source and drain, as a result of which only low parasitic capacitances occur. Moreover, the intermediate layer functions as a spacer in order additionally to obtain a capacitive decoupling between gate and source and between gate and drain. The intermediate layer is arranged in particular below or above the gate electrode. Preferably, the intermediate layer is arranged between the gate electrode and the source electrode and/or between the gate electrode and the drain electrode. The organic semiconductor functional layer is arranged in particular between the gate electrode and the substrate.

130 Advantageous configurations and developments of the invention can be gathered from the dependent claims, and also the description with reference to the drawings.

In accordance with one preferred embodiment of the present invention it is provided that the intermediate layer, perpendicular to a main plane of extent of the substrate, at least partly overlaps both the drain electrode and the source electrode. The capacitive decoupling can thus be maximized in an advantageous manner. It is also conceivable for the extent of the intermediate layer in the main plane of extent to go beyond the extent of the drain electrode and/or the source electrode.

In accordance with one preferred embodiment of the present invention it is provided that the intermediate layer has an interruption in the region of the gate electrode. The intermediate layer has said interruption in particular if the intermediate layer is arranged below the gate electrode (cf. exemplary embodiment according to FIG. 1). Advantageously, the intermediate layer is thus embodied as a continuous layer which has an interruption, that is to say a through opening, only in a partial region of the gate electrode in order that the functionality of the transistor is not impaired. It is also conceivable for the extent of the interruption in the main plane of extent to correspond to the extent of the gate insulator of the organic thin film transistor in the main plane of extent. Alternatively, the intermediate layer can also be embodied without an interruption, if the intermediate layer is arranged above the gate electrode (cf. exemplary embodiment according to FIG. 2).

In accordance with one preferred embodiment of the present invention it is provided that the intermediate layer, perpendicular to the main plane of extent, has an in particular average thickness of between 500 nm and 5 μm. The intermediate layer is thus made comparatively thick in particular in comparison with the gate insulator, as a result of which the parasitic capacitance of the intermediate layer is small relative to the capacitance of the active gate region, if for example the thickness of the gate insulator is between 50 nm and 500 nm. The intermediate layer preferably comprises a polymer-based spacer layer and/or a photoresist which originates from a preceding photolithographic patterning step, in particular for patterning the drain and source electrodes or the gate electrode, and was not eliminated afterward in the region of the drain and source electrodes or the gate electrode.

A further subject matter of the present invention is a display comprising a plurality of pixels, wherein at least one pixel comprises the organic thin film transistor according to the invention. Ultrathin and high-definition active matrix displays advantageously can be realized with the aid of the organic thin film transistor (OTFT) according to the invention.

A further subject matter of the present invention is the use of an organic thin film transistor according to the invention in a display, in particular in a high-definition active matrix display.

A further subject matter of the present invention is a method for producing the organic thin film transistor according to the invention, wherein in a first production step an organic semiconductor material for forming the organic semiconductor functional layer (4) is deposited on a substrate (2), in a second production step a first metal layer is arranged on the organic semiconductor material, in a third production step patterning of the first metal layer is carried out in order to form at least one first electrode, in a fourth production step a second metal layer is deposited, in a fifth production step patterning of the second metal layer is carried out in order to form at least one second electrode, wherein in an additional step carried out between the first and the second production steps or between the third and the fourth production steps, a gate insulation layer (7) is produced, characterized in that in an intermediate step an intermediate layer (9) for capacitive decoupling is applied to the at least one first electrode or to the at least second electrode.

The production method according to the invention makes possible simple and cost-effective production of the thin film transistor according to the invention, which transistor, in comparison with the prior art, has significantly lower parasitic capacitances between gate and source and between gate and drain and can thus find application for example in high-definition active matrix displays. In this case, the method exploits the fact that metals arranged on top of organic semiconductors, that is to say in the coplanar top gate arrangement employed here, can be patterned by wet etching, without the organic semiconductor being damaged in the process. In other words: the source, drain and gate electrodes can be formed in a traditional lithographic patterning method by means of wet etching, even though the transistor is based on an organic semiconductor. The gate insulation layer can then be formed in particular by means of wet-chemical anodization. In this case, the gate insulation layer comprises in particular an aluminum oxide layer. Alternatively, however, it would also be conceivable that in the fourth production step an insulating polymer layer is applied, in particular by printing or spin coating, as gate insulation layer. By means of the patterning described above, either the gate electrode is produced from the first metal layer and later the drain and source electrodes are produced from the second metal layer, or alternatively the drain and source electrodes are produced or alternatively the drain and source electrodes are produced from the first metal layer and later the gain electrode is produced from the second metal layer. In both cases, the intermediate layer is arranged respectively between the gate and drain electrodes and between the gate and source electrodes. Depending on which layer structure finds application, the additional step for forming the gate insulation layer is carried out before or after the intermediate step for forming the intermediate layer. The intermediate step is furthermore preferably carried out between the second and fourth production steps and in particular between the third and fourth production steps. Optionally, a planarization step is also carried out before the first production step, in which planarization step an auxiliary layer as planarization layer is deposited on the substrate for the purpose of planarizing the substrate.

In accordance with one preferred embodiment of the present invention it is provided that between the first step and the second step an organic functional layer is arranged on the semiconductor functional layer, in a manner preferably completely covering the semiconductor functional layer, wherein the functional layer is partly removed between the third step and the fourth step. The functional layer ensures that the metal electrode deposited in the second production step wets the surface of the semiconductor functional layer better, that is to say that in the second step the metal film is deposited very homogeneously on the semiconductor material and local accumulations of metal atoms at crystal boundaries of the semiconductor material are suppressed. As a result, in the third step the metal electrode can be patterned better, for example by means of wet-chemical etching. This results in a temporally homogeneous etching behavior on the surface and the metal can be removed without residues even from the crystal boundaries of the semiconductor material.

During the partial removal of the functional layer, in particular that part of the functional layer is removed which is freely accessible in a direction orthogonal to the main plane of extent of the functional layer after the third step. The regions of the functional layer which are covered by the first metal layer are preferably not removed.

The functional layer is preferably applied with a layer thickness of 1 nm to 100 nm. The functional layer is preferably soluble in a fluorinated solvent, for example hydrofluoroether. It is conceivable for the functional layer to comprise or consist of C60F36, C60F48, F4-TCNQ, and/or F6-TNNCQ molecules. An additional advantage of the functional layer comprising C60F36, C60F48, F4-TCNQ, and/or F6-TNNCQ molecules is that the charge carrier injection and extraction at the source contact and drain contact, respectively, are removed. The contact resistance is thus reduced.

In accordance with one preferred embodiment of the present invention it is provided that after the functional layer has been partly removed, defects are annealed by means of a thermal treatment, wherein the thermal treatment is preferably carried out between the partial removal of the functional layer and the fourth step.

In accordance with one preferred embodiment of the present invention it is provided that the intermediate step comprises applying a polymer-based spacer layer. It is conceivable that the intermediate step comprises applying photoresist in the third production step and the photoresist in the region of at least one first electrode remains contained in the layer structure as intermediate layer for capacitive decoupling.

In accordance with one preferred embodiment of the present invention it is provided that in the second production step a double layer composed of aluminum and gold as first metal layer is arranged on the organic semiconductor material, wherein in the third production step the gold layer of the double layer is photolithographically patterned and wherein in the additional step the aluminum layer of the double layer is anodized in order to form the gate insulation layer. The use of the double layer composed of aluminum and gold has advantages in particular for n-doped semiconductors, since the drain and source electrodes are formed from aluminum.

In accordance with one preferred embodiment of the present invention it is provided that the organic semiconductor material is doped in the region of the source and drain electrodes, in particular by means of molecular dopants, such as F4-TCNQ, F6-TCNNQ, C60F36, W2(hpp)4, or inorganic dopants, such as WoO3, MoO3.

Further details, features and advantages of the invention are evident from the drawings, and also from the following description of preferred embodiments with reference to the drawings. In this case, the drawings merely illustrate exemplary embodiments of the invention which do not restrict the essential concept of the invention.

BRIEF DESCRIPTION OF THE DRAWINGS

FIGS. 6A-1 schematically show a method for producing an organic thin film transistor in accordance with an exemplary further embodiment of the present invention.

DETAILED DESCRIPTION

In the various figures, identical parts are always provided with the same reference signs and, therefore, are generally also referred to or mentioned only once in each case.

Figure 1:
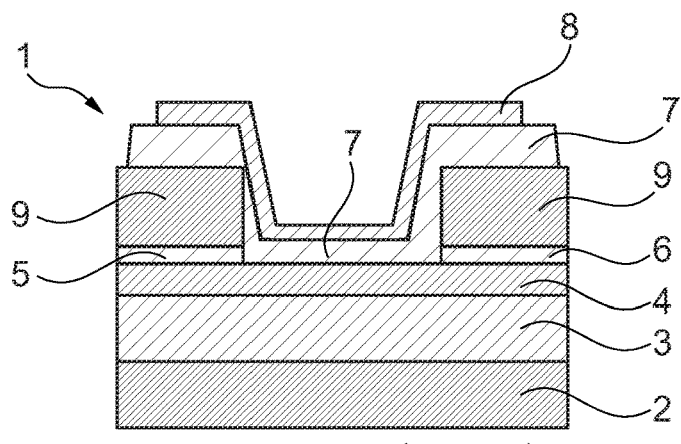
FIG. 1 shows a schematic sectional view of an organic thin film transistor in accordance with an exemplary first embodiment of the present invention.

FIG. 1 illustrates a schematic sectional view of a thin film transistor 1 in accordance with an exemplary first embodiment of the present invention.

The organic thin film transistor (OTFT) 1 comprises a substrate 2, on which is arranged an organic semiconductor material for forming an organic semiconductor functional layer 4. Optionally, an auxiliary layer 3 for planarizing the substrate 2 is provided between the organic semiconductor functional layer 4 and the substrate 2. In this case, the substrate 2, the auxiliary layer 3 and the layer composed of organic semiconductor material 4 extend parallel to a main plane of extent 10.

A source electrode 5 and a drain electrode 6 composed of metal are formed in a manner spatially separated from one another on the organic semiconductor material 4. In the main plane of extent 10 a gate insulation layer 7 is formed between the source electrode 5 and the drain electrode 6 in order to electrically insulate the organic semiconductor functional layer 4 from a gate electrode 8.

In the region of the source electrode 5 the organic thin film transistor 1 comprises an intermediate layer 9, which serves to obtain a capacitive decoupling between the source electrode 5 and the gate electrode 8. For this purpose, the intermediate layer 9 completely covers the source electrode 5 along a direction perpendicular to the main plane of extent 10. In other words: the intermediate layer 9 and the source electrode 5 completely overlap one another. Analogously, an intermediate layer 9 is also arranged in the region of the drain electrode 6, said intermediate layer completely overlapping the drain electrode 6 and serving to obtain a capacitive decoupling between the drain electrode 6 and the gate electrode 8. The gate insulation layer 7 extends laterally in each case across the intermediate layer 9. Furthermore, the gate electrode 8 is arranged on the gate insulation layer 7, said gate electrode likewise both extending over the active region of the transistor and projecting laterally slightly over the source and drain electrodes 5, 6. This overlap inevitably gives rise to unwanted parasitic capacitances between the source electrode 5 and the gate electrode 8 and/or between the drain electrode 6 and the gate electrode 8.

The intermediate layer 9 comprises a preferably polymer-based spacer layer (alternatively, oxides, nitrides or small molecule layers would also be conceivable as spacer layer), which can be for example a non-removed photoresist from a preceding photolithographic patterning method for patterning the source and drain electrodes 5, 6. The intermediate layer 9 functions as a spacer and for this purpose preferably has a thickness of between 500 nm and 5 µm. In comparison with the typical thickness of the gate insulation layer 7 of between 50 nm and 500 nm, the intermediate layer 9 is therefore comparatively thick, such that the parasitic capacitances between the source electrode 5 and the gate electrode 8 and/or between the drain electrode 6 and the gate electrode 8 advantageously become very small in comparison with the capacitance of the active gate region. Consequently, the unity-gain cut-off frequency $f_T$ can be increased and the "voltage kickback" (VKB) effect can be reduced, as a result of which the organic thin film transistor 1 according to the invention becomes faster and more energy-efficient and can find application for example in high-definition active matrix displays.

A further advantage of the organic thin film transistor 1 according to the invention is that the electrodes can be formed by means of a conventional photolithographic patterning with subsequent wet-chemical anodization, without the organic semiconductor material incurring damage in the process. The production of the organic thin film transistor 1 according to the invention can thus be effected in the manner of self-patterned electrodes, as a result of which low parasitic capacitances and cost-effective production are made possible.

The organic thin film transistor 1 shown in FIG. 1 is produced by firstly providing a substrate 2 (zeroth production step), which is optionally coated with the auxiliary layer 3 for planarizing the substrate 2. In the first production step, the organic semiconductor material for forming the organic functional layer 4 is then deposited on the substrate 2 or respectively the auxiliary layer 3.

In a second production step, subsequently a first metal layer, for example composed of gold, is applied to the organic functional layer 4, for example by means of physical vapor deposition (PVD), or vapor deposition. In the third production step, said first metal layer is patterned by means of conventional photolithographic patterning, as a result of which the source electrode 5 and the drain electrode 6 are formed. For this purpose, the metal layer is firstly coated with a photoresist as masking layer, subsequently exposed and then etched wet-chemically (aqueous solution) in such a way that the underlying semiconductor does not incur any damage. For noble metals such as gold or silver, for example, this etching step can be carried out by means of KI/I2 solution or aqua regia. For copper, metal chloride salt solutions composed of e.g. NaCl, CuCl2, MgCl2 or the like are suitable. Said salt solutions preferably contain hydrogen chloride (HCl). Base metals such as Al, for example, can be etched using basic solutions such as NaOH or tetramethyl-ammonium hydroxides. The concentrations of the respective substances in an aqueous solution determine the etching rate. In order that the lithographic structures are transferred with structural fidelity, it is recommended to use diluted etching solutions: e.g. KI/I2 diluted with H2O (ratio 1:10), or aqua regia diluted with H2O (ratio 1:10). In a succeeding additional step, the gate insulation layer 7 is formed by applying a thin insulating polymer layer, which is applied by printing or spin coating, for example. Alternatively, insulation layers composed of aluminum, titanium or hafnium oxide, for instance, are also conceivable.

In order to form the intermediate layer 9, either the photoresist in the region of the source and drain electrodes 5, 6 is not removed after the third production step, such that the photoresist subsequently functions as intermediate layer 9 for capacitive decoupling. The intermediate step thus comprises that partial step of the third production step in which the photoresist is applied. Alternatively, an intermediate step for applying a polymeric spacer layer is carried out after the third production step, said layer constituting the intermediate layer 9. The intermediate step is carried out either before or after the additional step.

Afterward, in a fourth production step a second metal layer is applied, which is photolithographically patterned in order to form the gate electrode 8 in a fifth production step.

It is optionally conceivable for the organic semiconductor material additionally to be doped in the region of the source and drain electrodes 5, 6, in particular by means of molecular dopants, such as F4-TCNQ, F6-TCNNQ, C60F36, W2(hpp)4, or inorganic dopants, such as WoO3, MoO3.

Figure 2:
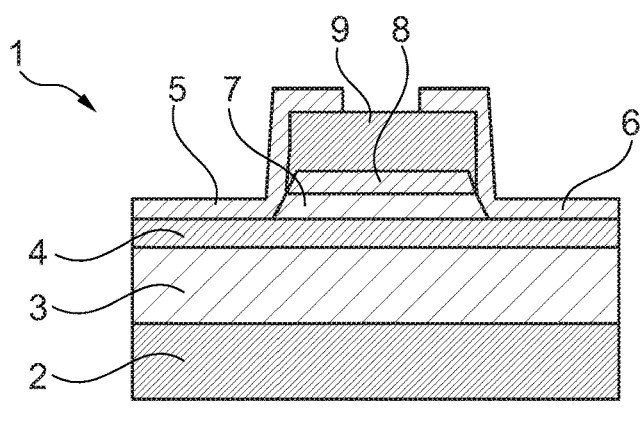
FIG. 2 shows a schematic sectional view of an organic thin film transistor in accordance with an exemplary second embodiment of the present invention.

FIG. 2 illustrates a schematic sectional view of an organic thin film transistor 1 in accordance with an exemplary second embodiment of the present invention.

The second embodiment substantially corresponds to the first embodiment explained with reference to FIG. 1, with the difference that the intermediate layer 9 is arranged on the gate electrode 8 and thus extends between the gate electrode 8 and the drain and source electrodes 5, 6 led partly over the intermediate layer 9 or gate electrode 8.

This second embodiment is produced analogously to the first embodiment, with the additional step being carried out before the second production step in order to produce the gate insulation layer 7 below the gate electrode 8 to be produced subsequently. Furthermore, the patterning of the first metal layer is carried out in the third production step in order to form the gate electrode 8. The patterning of the second metal layer in the fifth method step then serves for forming the drain and source electrodes (5, 6). For the patterning of the gate electrode (8), and also of source and drain, recourse is had to wet-chemical etching processes as described in the first embodiment. The process of wet-chemical oxidation is used for the production of the gate insulation layer 7. In this case, the gate electrode 8 consists of a wet-chemically oxidizable metal, or of a layer sequence of an oxidizable metal and a noble metal (e.g. aluminum and gold, cf. third embodiment).

Figure 3:
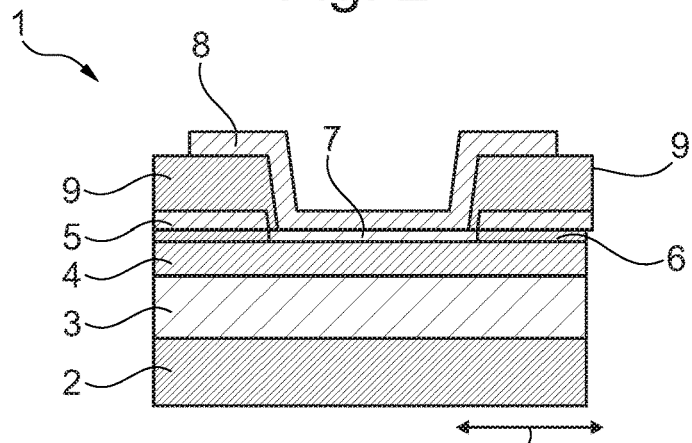
FIG. 3 shows a schematic sectional view of an organic thin film transistor in accordance with an exemplary third embodiment of the present invention.

FIG. 3 illustrates a schematic sectional view of an organic thin film transistor 1 in accordance with an exemplary third embodiment of the present invention.

The third embodiment substantially corresponds to the first embodiment explained with reference to FIG. 1, but in the second production step, rather than a single metal layer, a double layer composed of aluminum and gold was deposited on the organic semiconductor material. In this case, a thin layer of chromium is preferably deposited between the layer of aluminum and the layer of gold. Said layer of chromium prevents the formation of undesired alloys between Al and Au. The anodization is effected in an aqueous solution of citric acid (2-hydroxypropane-1,2,3-tricarboxylic acid) having a concentration of 1 mM/l.

Figure 4:
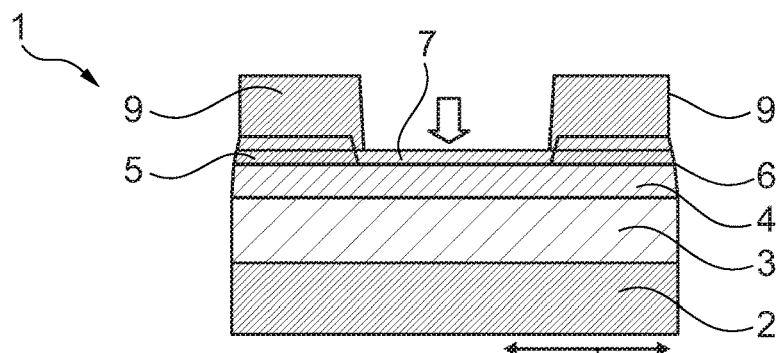
FIG. 4 shows a production step for producing the organic thin film transistor in accordance with the exemplary third embodiment of the present invention.

In the third production step, photolithographic patterning of the gold layer is then carried out in order to form the source and drain electrodes 5, 6. The photoresist in the region of the source and drain electrodes 5, 6 is not removed and thus functions as an intermediate layer 9 in the form of the polymer-based spacer layer. In the succeeding fourth production step, by means of wet-chemical anodization of the aluminum layer uncovered in the third production step, the gate insulation layer 7 is formed in the form of an aluminum oxide layer ($Al_2O_3$). The thickness of the gate insulation layer 7 is again controlled by means of the electrical voltage applied during the anodization. A schematic detailed diagram of the wet-chemical anodization of the aluminum layer is illustrated in FIG. 4. The anodization is effected in an aqueous solution of citric acid (2-hydroxypropane-1,2,3-tricarboxylic acid) having a concentration of 1 mM/l.

Afterwards, in a fifth production step a metal layer is applied, which is photolithographically patterned in order to form the gate electrode 8 in a sixth production step.

The use of the double layer composed of aluminum and gold has advantages in particular for n-doped semiconductors since the drain and source electrodes 5, 6 are formed from aluminum.

Optionally, it is conceivable for the organic semiconductor material additionally to be doped in the region of the source and drain electrodes 5, 6, in particular by means of molecular dopants, such as F4-TCNQ, F6-TCNNQ, C60F36, W2(hpp)4, or inorganic dopants, such as WoO3, MoO3.

Figure 5A:
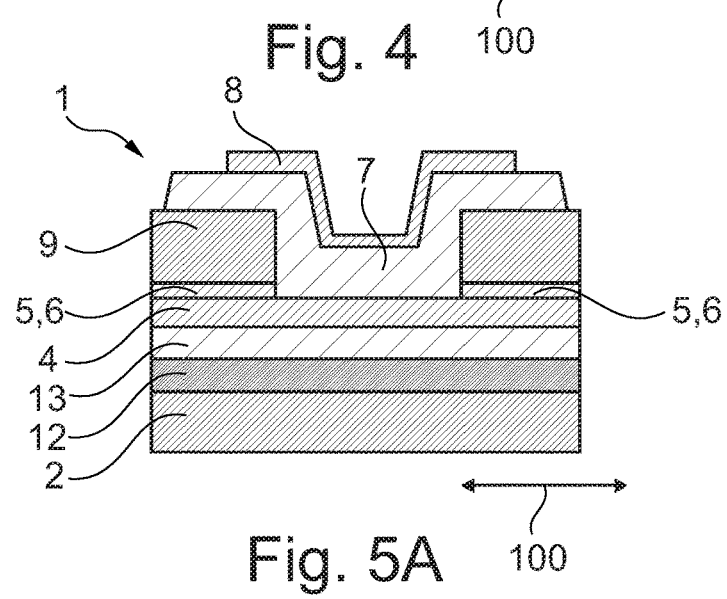
FIGS. 5A-5B show a test structure of an organic thin film transistor together with an associated measurement series for determining the charge carrier mobility.
Figure 5B:
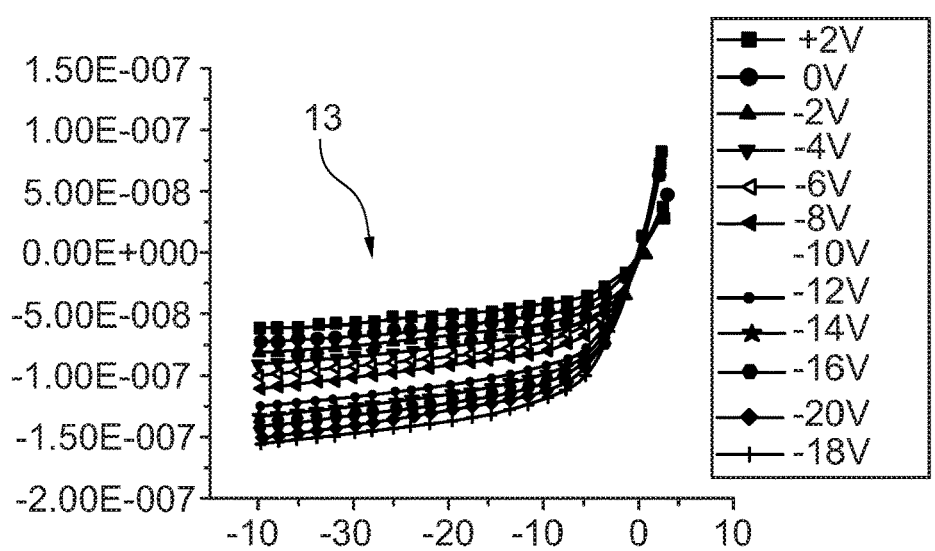

FIGS. 5A and 5B show a test structure of an organic thin film transistor 1 together with an associated measurement series 11 for determining the charge carrier mobility.

In principle, in the past it has been assumed that organic semiconductor material is damaged during patterning by means of lithographic methods.

Therefore, the organic thin film transistor 1 illustrated in FIG. 5A was realized as a test structure, substantially corresponding to the structure of the organic thin film transistor 1 in accordance with the first embodiment of the present invention as illustrated in FIG. 1, wherein between the organic semiconductor functional layer 4 and the substrate 1 additionally a further gate electrode 12 is implemented directly on the substrate 2 and a further gate insulation layer 13 is implemented between the further gate electrode 12 and the organic semiconductor functional layer 4.

In order to check whether the organic semiconductor material is actually damaged by the lithographic patterning of the metal layers, in the case of the test structure the charge carrier mobility in the region of the gate electrode 8 was then compared with the charge carrier mobility in the region of the further gate electrode 12. The measurement results are illustrated as measurement series 11 in FIG. 5B for various gate-source voltages (see the legend). The source-drain voltage in volts is plotted on the abscissa axis, while the source-drain current intensity in amperes is plotted on the ordinate axis.

The result is that the charge carrier mobility was not impaired by the lithographic patterning. It has thus been discovered that some metals can be patterned directly on the organic semiconductor by means of wet etching, without the organic semiconductor material therefore being impaired.

Figure 6A:
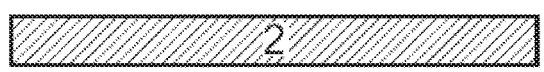
Figure 6F:
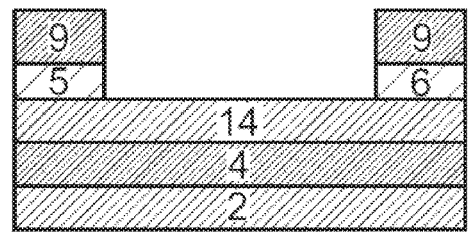
Figure 6B:
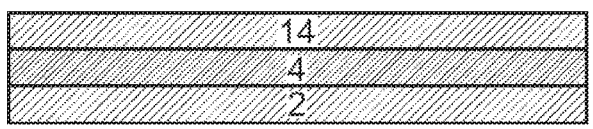
Figure 6G:
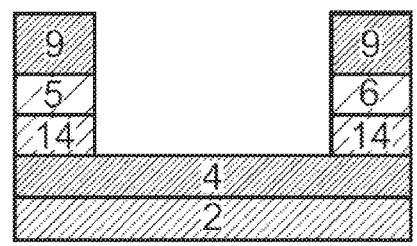
Figure 6C:
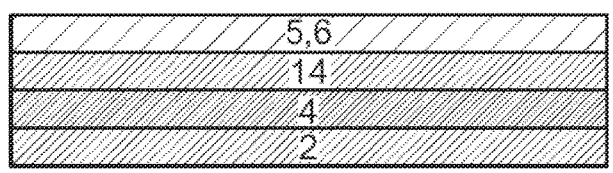
Figure 6H:
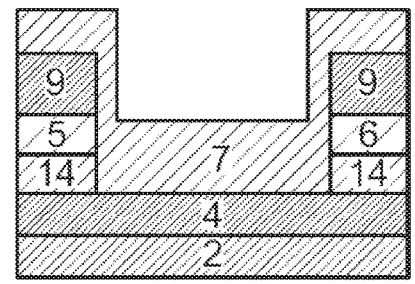
Figure 6D:
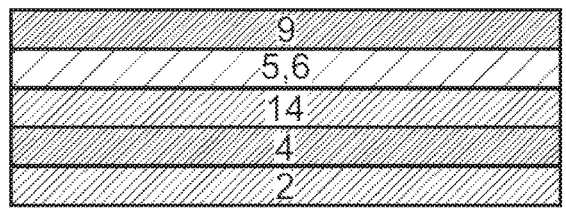
Figure 6E:
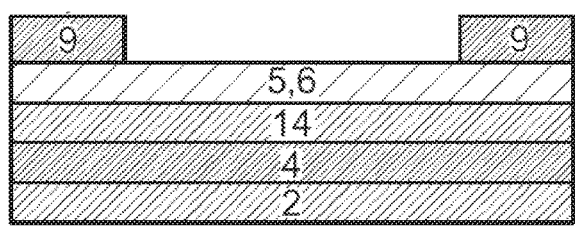
Figure 6I:
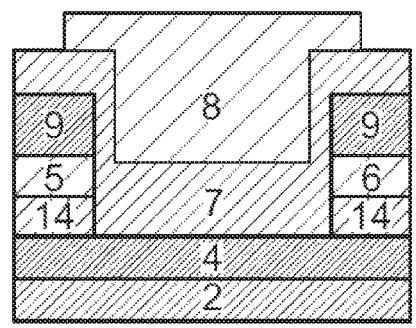

FIGS. 6A-6I schematically illustrate a method for producing an organic thin film transistor 1 in accordance with an exemplary further embodiment of the present invention. FIG. 6A shows the process of providing the substrate 2. In the first step, the organic semiconductor functional layer 4 is deposited onto the substrate 2, followed by a functional layer 14. The functional layer 14 is an organic functional layer 14 and has a thickness of between 1 nm and 100 nm. The functional layer 14 is soluble with a solvent. FIG. 6C illustrates the process of depositing the first metal layer (designated here by 5, 6) in the second step, from which layer the source electrode 5 and the drain electrode 6 are fabricated in a later step. After the first metal layer 5, 6 has been deposited, in the intermediate step the intermediate layer 9 is applied, as shown in FIG. 6D, and is patterned, as shown in FIG. 6E. FIG. 6F shows the third step, in which the first metal layer 5, 6 is patterned to form the source electrode 5 and to form the drain electrode 6. Afterward, the functional layer 14 is partly dissolved as shown in FIG. 6G. This is done where the functional layer 14 is not covered after the patterning of the first metal layer 5, 6 in the third step. FIG. 6H shows the production of the gate insulation layer 7 in the additional step. Afterward, the gate electrode 8 is deposited and patterned, as shown in FIG. 6I.

LIST OF REFERENCE SIGNS

1 Organic thin film transistor
2 Substrate
3 Auxiliary layer for planarization
4 Organic semiconductor functional layer
5 Source electrode
6 Drain electrode
7 Gate insulation layer
8 Gate electrode
9 Intermediate layer
10 Main plane of extent
11 Measurement series
12 Further gate electrode
13 Further gate insulation layer
14 Functional layer

The invention claimed is:

1. An organic thin film transistor comprising:
a substrate, a source electrode, a drain electrode, a gate electrode arranged in a top gate arrangement, and an organic semiconductor functional layer, wherein the source electrode, the drain electrode, and the gate electrode are all arranged in a coplanar layer structure on one side of the organic semiconductor functional layer, and
wherein the organic thin film transistor comprises an intermediate layer configured for capacitive decoupling of the gate electrode from the source electrode and/or from the drain electrode, and the intermediate layer is arranged on the gate electrode and extends between the gate electrode and both of the drain electrode and the source electrode, which extend partly over the intermediate layer or the gate electrode,
wherein the intermediate layer comprises a thickness in a range of 500 nm to 5 µm,
wherein each of the source electrode and the drain electrode have a Z-shaped cross section, and
wherein the intermediate layer is arranged above the gate electrode and is embodied without an interruption.

2. The organic thin film transistor according to claim 1, wherein the organic semiconductor functional layer is arranged between the gate electrode and the substrate.

3. The organic thin film transistor according to claim 1, wherein the intermediate layer, perpendicular to a main plane of extent of the substrate, at least partly overlaps both the drain electrode and the source electrode in a direction perpendicular to a main plane of extension of the substrate.

4. The organic thin film transistor according to claim 1, wherein the drain electrode or the source electrode extends over the gate electrode.

5. The organic thin film transistor according to claim 1, wherein the organic thin film transistor comprises a gate insulation layer between the gate electrode and the organic semiconductor functional layer, and wherein the drain electrode and/or the source electrode extend over the gate insulation layer.

6. The organic thin film transistor according to claim 1, wherein the drain electrode and/or the source electrode contact the gate insulation layer.

7. The organic thin film transistor according to claim 1, wherein the source electrode is a mirror image of the drain electrode.

8. The organic thin film transistor according to claim 1, wherein the organic thin film transistor comprises a gate insulation layer, and each of the source electrode and the drain electrode are directly above the intermediate layer, the gate electrode, and the gate insulation layer.

9. The organic thin film transistor according to claim 8, wherein at least part of the source electrode and at least part of the drain electrode are arranged directly above the organic semiconductor functional layer.

10. The organic thin film transistor according to claim 1, wherein the drain electrode and the source electrode both extend over the gate electrode.

11. The organic thin film transistor according to claim 10, wherein the intermediate layer is a single layer.

12. The organic thin film transistor according to claim 11, wherein a thickness of the single intermediate layer is greater than a thickness of the gate electrode.

13. The organic thin film transistor according to claim 11, wherein the intermediate layer is free from contacting the organic semiconductor functional layer.

14. The organic thin film transistor according to claim 1, wherein the Z-shaped cross section of each of the source electrode and the drain electrode is defined by a first substantially horizontal portion, a substantially vertical portion, and a second substantially horizontal portion,
wherein the first substantially horizontal portion extends partially along a top surface of the organic semiconductor functional layer, a first end of the substantially vertical portion extends from the first substantially horizontal portion, and the second substantially horizontal portion extends from an opposing second end of the substantially vertical portion, the second substantially horizontal portion extends partially along a top surface of the intermediate layer.

15. The organic thin film transistor according to claim 14, wherein the source electrode is a mirror image of the drain electrode.

16. A display comprising a multiplicity of pixels, wherein at least one pixel comprises the organic thin film transistor according to claim 1.

17. A method for producing the organic thin film transistor according to claim 1, wherein:
in a first production step, an organic semiconductor material is deposited on the substrate for forming the organic semiconductor functional layer,
in a second production step, a first metal layer is arranged on the organic semiconductor material,
in a third production step, the first metal layer is structured for forming at least one first electrode,
in a fourth production step, a second metal layer is deposited,
in a fifth production step, the second metal layer is structured for forming at least one second electrode.

18. The method according to claim 17, wherein an intermediate step is carried out between the second production step and the fourth production step or between the third production step and the fourth production step.

19. The method according to claim 18, wherein the intermediate step comprises applying photoresist in the third production step, and the photoresist remains contained in the layer structure as an intermediate layer for capacitive decoupling in a region of the at least one first electrode.

20. The method according to claim 18, wherein the intermediate step comprises applying photoresist in the third production step and the photoresist remains contained in the layer structure as an intermediate layer for capacitive decoupling in the region of the source and drain electrodes.

* * * * *